US007005719B2

(12) United States Patent
Masumoto

(10) Patent No.: US 7,005,719 B2
(45) Date of Patent: Feb. 28, 2006

(54) INTEGRATED CIRCUIT STRUCTURE HAVING A FLIP-CHIP MOUNTED PHOTORECEIVER

(75) Inventor: Kenji Masumoto, Oita (JP)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/788,552

(22) Filed: Feb. 27, 2004

(65) Prior Publication Data

US 2005/0189631 A1 Sep. 1, 2005

(51) Int. Cl.
*H01L 31/0232* (2006.01)
(52) U.S. Cl. .................. 257/432; 257/779; 257/433
(58) Field of Classification Search ............... 257/431, 257/432, 433, 434, 779; 438/116, 29, 98, 438/24, 27
See application file for complete search history.

(56) References Cited

U.S. PATENT DOCUMENTS

| 5,237,434 A | 8/1993 | Feldman et al. ............. 359/19 |
| 5,394,490 A | 2/1995 | Kato et al. .................... 385/14 |
| 5,495,450 A * | 2/1996 | Zollo et al. ................... 365/218 |
| 5,818,404 A | 10/1998 | Lebby et al. ................. 345/82 |
| 5,939,773 A | 8/1999 | Jiang et al. .................. 257/666 |
| 5,949,655 A | 9/1999 | Glenn ......................... 361/783 |
| 6,489,670 B1 | 12/2002 | Peterson et al. ............ 257/686 |
| 6,803,639 B1 * | 10/2004 | Ono et al. ................... 257/433 |
| 6,859,031 B1 * | 2/2005 | Pakdaman et al. .......... 324/233 |

* cited by examiner

*Primary Examiner*—S. V. Clark
(74) *Attorney, Agent, or Firm*—Yingsheng Tung; Wade James Brady, III; Frederick J. Telecky, Jr.

(57) ABSTRACT

An apparatus comprising an integrated circuit structure is provided. The integrated circuit structure comprises a substrate and a photoreceiver. The substrate has a first side and a second side opposite the first side and includes a first light passage area operable to allow light to pass through. The photoreceiver has an aperture located on a first side of the photoreceiver and is flip-chip mounted to the substrate such that the first side of the photoreceiver faces the second side of the substrate. The photoreceiver is operable to translate light signals received through the aperture into digital signals and to transmit the digital signals. The first light passage area is aligned with the aperture of the photoreceiver such that the light signals may be received through the light passage area and into the aperture of the photoreceiver.

27 Claims, 2 Drawing Sheets

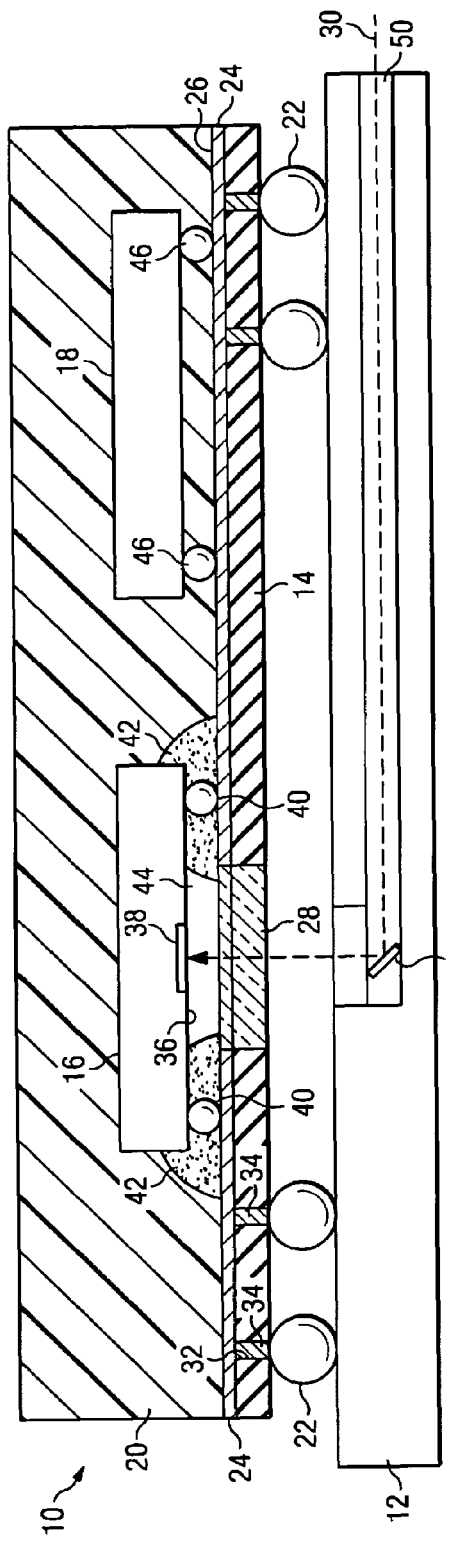
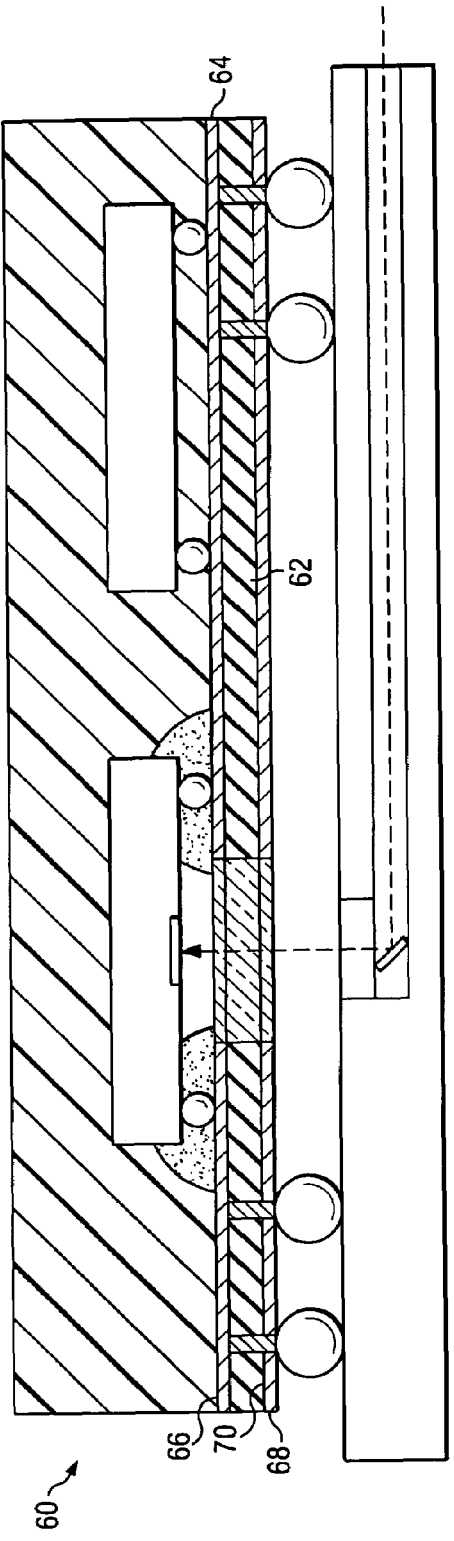

INTEGRATED CIRCUIT STRUCTURE HAVING A FLIP-CHIP MOUNTED PHOTORECEIVER

TECHNICAL FIELD OF THE INVENTION

This invention relates in general to integrated circuit structures, and, more particularly, to an integrated circuit structure having a flip-chip mounted photoreceiver.

BACKGROUND OF THE INVENTION

Although integrate circuit (IC) processor speeds have continued to increase rapidly, electrical interconnect speeds have not increased at the same rate. Thus, electrical interconnects create a bottleneck that limits the ultimate capacity of the associated processors. Recently, optical interconnects have been introduced as a solution to address most; if not all, of the problems associated with electrical interconnects. Optical interconnects may be used to allow board-to-board, chip-to-chip, and on-chip optical communication, which may provide benefits including low latency, high throughput, high density, high bandwidth, and integration with existing silicon technology.

For chip-to-chip or board-to-board optical communication of signals, an IC package mounted on printed circuit board may include a photoreceiver die that faces the printed circuit board to receive light signals being communicated by or through the circuit board. Typically, the substrate of the IC package includes three or more layers, each comprising a copper trace or other conductive layer. However, as small consumer electronics such as mobile phones and personal digital assistants (PDAs) continue to proliferate, the need for smaller IC chip packages has increased. Thus, it would be desirable to provide reduced-sized IC packages that include one or more photoreceivers for chip-to-chip or board-to-board optical communication of signals.

SUMMARY OF THE INVENTION

In accordance with the present invention, an IC package structure includes a photoreceiver flip-chip mounted to the package substrate in order to provide an IC package structure having a reduced size as compared with prior IC package structures.

According to one embodiment, an apparatus comprising an integrated circuit structure is provided. The integrated circuit structure comprises a substrate and a photoreceiver. The substrate has a first side and a second side opposite the first side and includes a first light passage area operable to allow light to pass through. The photoreceiver has an aperture located on a first side of the photoreceiver and is flip-chip mounted to the substrate such that the first side of the photoreceiver faces the second side of the substrate. The photoreceiver is operable to translate light signals received through the aperture into digital signals and to transmit the digital signals. The first light passage area is aligned with the aperture of the photoreceiver such that the light signals may be received through the light passage area and into the aperture of the photoreceiver.

According to another embodiment, a substrate including a first light passage area operable to allow light to pass through is provided. The substrate has a first side adapted to face a circuit board and a second side opposite the first side. A photoreceiver is flip-chip mounted to the substrate such that an aperture located on a first side of the photoreceiver faces the second side of the substrate. The aperture is aligned with the first light passage area of the photoreceiver such that light signals may be received through the light passage area and into the aperture of the photoreceiver. The photoreceiver is operable to translate the light signals into digital signals and to transmit the digital signals.

Various embodiments of the present invention may benefit from numerous advantages. It should be noted that one or more embodiments may benefit from some, none, or all of the advantages discussed below.

One advantage is that an IC package structure including a photoreceiver flip-chip mounted to the package substrate may have a reduced size as compared with prior IC package structures. The substrate of the IC package structure may be a single-layer or two-layer substrate, as compared with prior substrates having three or more layers. Thus, the thickness of the substrate may be less than the thickness of prior substrates. For example, the thickness of the substrate may be less than 150 microns. In certain embodiments, the thickness of the substrate may is approximately 100 microns. Thus, the overall thickness of the IC package structure may be reduced as compared with prior IC package structures. In addition, single-layer or two-layer substrates are less expensive to manufacture than prior substrates having three or more layers. Thus, the cost of IC package structures provided as described herein may be reduced as compared with prior IC package structures.

Another advantage is that in certain embodiments, due to the configuration of the IC package structure, the thickness of the encapsulation layer of the IC package structure may be reduced as compared with the encapsulation layer of prior IC package structures having a photoreceiver. For example, the encapsulation layer may be reduced by approximately 25 microns as compared with the encapsulation layer of prior IC package structures. Thus, the overall thickness of the IC package structure may be reduced.

Other advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which:

FIG. 1 illustrates an example IC package structure having a photoreceiver flip-chip mounted to a single-layer substrate for receiving optical signals via a circuit board;

FIG. 2 illustrates another example IC package structure a photoreceiver flip-chip mounted to a two-layer substrate for receiving optical signals via a circuit board.

DETAILED DESCRIPTION OF THE DRAWINGS

Figure 3:
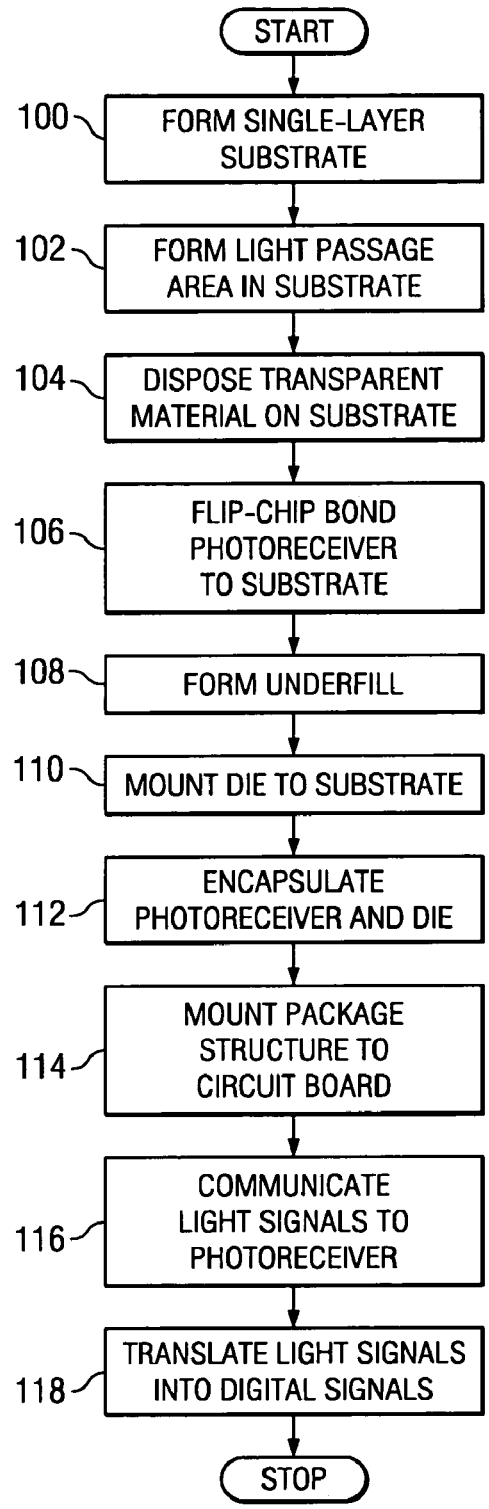
FIG. 3 illustrates an example method of forming the IC package structure shown in FIG. 1.

Example embodiments of the present invention and their advantages are best understood by referring now to FIGS. 1 through 4 of the drawings, in which like numerals refer to like parts.

Among other things, various embodiments of the present invention are directed toward IC package structures includes a photoreceiver flip-chip mounted to the package substrate in order to provide an IC package structure having a reduced size as compared with prior IC package structures.

FIG. 1 illustrates an example IC package structure 10 that can receive optical signals via a circuit board 12 according to one embodiment of the invention. IC package structure 10 includes a substrate 14, a photoreceiver 16, a die 18, and an encapsulation layer 20. IC package structure 10 is coupled to circuit board 12 by one or more solder bumps 22.

Substrate 14 may be any type of suitable for an integrated circuit, such as, for example, laminate FR4; laminate FR5; laminate BT, High Tg FR4; Teflon; ceramic/glass; polyamide; or leadframe. Substrate 14 includes a conductive layer 24 formed on the top surface 26 of substrate 14. Conductive layer 24 may include any one or more generally conductive materials, such as copper or gold, for example. In certain embodiments, conductive layer 24 is a copper trace formed on substrate 14. Because substrate 14 includes a single conductive layer 24, it may be referred to as a single-layer substrate. However, as discussed below with reference to FIG. 2, in certain other embodiments, substrate 14 may be a two-layer substrate including conductive layers formed on both the top and bottom sides of substrate 14.

Since substrate 14 may be a single-layer or two-layer substrate, the thickness of substrate 14 may be less than the thickness of substrates of prior IC packages having three or more layers. For example, the thickness of substrate 14 may be less than 150 microns. In certain embodiments, the thickness of substrate 14 may is approximately 100 microns. Thus, the overall thickness of IC package structure 10 may be less than that of prior IC package structures. In addition, single-layer or two-layer substrates are less expensive to manufacture than prior substrates having three or more layers. Thus, the cost of IC package structure 10 may be reduced as compared with prior IC package structures.

In addition, substrate 14 includes a light passage area 28 through which light signals 30 may pass. Light passage area 28 may include a hole, opening or hollow areas, or may include one or more substances having physical properties suitable for allowing the passage of light signals without unacceptable deterioration of the light signals. For example, light passage area 28 may include glass, substantially transparent plastic filler, or other at least substantially transparent material such as a substantially transparent resin or epoxy.

In certain embodiments, substrate 14 may also include one or more via holes 32 that may be filled with conductive vias 34 to form conductive paths between conductive layer 24 on substrate 14 and solder bumps 22. Vias 34 may comprise one or more conductive materials, such as gold, lead, or copper, for example. In certain embodiments, vias 34 are formed from the same material as solder bumps 22. Solder bumps 22 physically couple IC package structure 10 to circuit board 12 and may be formed from any suitable solder material, such as gold, nickel, tin, tin alloys (such as tin/copper, tin/indium, tin/silver, tin/bismuth or tin/lead), an electroless nickel/immersion gold alloy, or a conductive adhesive compound, for example.

Photoreceiver 16 comprises any device operable to receive light signals 30 in the form of light waves and to convert such light signals 30 to digital signals. For example, photoreceiver 16 may comprise a silicon photodiode or a compound semiconductor photodiode, such as a GaN photodiode, for example.

Photoreceiver 16 includes a side 36 having a light receiving aperture 38 operable to receive light signals 30 such that photoreceiver 16 may convert such light signals 30 into digital signals. Thus, photoreceiver 16 is flip-chip bonded to substrate 14 by one or more solder bumps 40 such that side 36 having light receiving aperture 38 faces circuit board 12.

Like solder bumps 22, solder bumps 40 may be formed from any suitable solder material, such as gold, nickel, tin, tin alloys (such as tin/copper, tin/indium, tin/silver, tin/bismuth or tin/lead), an electroless nickel/immersion gold alloy, or a conductive adhesive compound, for example.

An underfill 42 may be formed around solder bumps 40 to provide an improved connection between photoreceiver 16 and substrate 14. In certain embodiment, underfill 42 comprises a no-flow underfill material that includes a flux material mixed with any suitable underfill material, such as an epoxy or suitable organic material, for example. The flux material acts to clean the surface of solder bumps 40 such that an effective solder bond is created between solder bumps 40 and substrate 14 during the bonding reflow process. Once underfill 42 is cured through the reflow process, it provides improved structural integrity for the solder bonds.

An area generally between aperture 38 of photoreceiver 16 and substrate 14, indicated in FIG. 1 as light passage area 44, may allow light signals 30 to pass such that light signals 30 may enter aperture 38. In the embodiment shown in FIG. 1, light passage area 44 is defined by the shape of underfill 42, which is formed around light passage area 44. Like light passage area 28, light passage area 44 may include a hole, opening or hollow areas, or may include one or more substances having physical properties suitable for allowing the passage of light signals without unacceptable deterioration of the light signals. For example, light passage area 28 may include glass, substantially transparent plastic filler, or other at least substantially transparent material such as a substantially transparent resin or epoxy.

In certain other embodiments, underfill 42 comprises one or more-materials having physical properties suitable for allowing the passage of light signals and extends into the area between aperture 38 of photoreceiver 16 and substrate 14. In such embodiments, light passage area 44 comprises the portion of underfill 42 through which light signals 30 may pass to be received by aperture 38.

Die 18 may comprise any IC die or chip operable to receive from photoreceiver 16 and process digital signals translated from light signals 30 by photoreceiver 16. For example, die 18 may be a driver die or other digital signal processing (DSP) chip. Die 18 may be mounted on substrate 14 by any suitable means, such as by flip-chip bonding or wire bonding, for example. In the embodiment shown in FIG. 1, die 18 is flip-chip bonded to substrate 14 by one or more solder bumps 46. Like solder bumps 22 and 40, solder bumps 46 may be formed from any suitable solder material, such as gold, nickel, tin, tin alloys (such as tin/copper, tin/indium, tin/silver, tin/bismuth or tin/lead), an electroless nickel/immersion gold alloy, or a conductive adhesive compound, for example.

Encapsulation layer 20 may comprise any one or more materials suitable for encapsulating an IC package structure 10, such as various resins or mold compounds. Encapsulation layer 20 may be formed over IC package structure 10 in any suitable manner, such as by transfer molding, compression molding, potting, or glob top processes. In certain embodiments, due to the configuration of IC package structure 10, the thickness of encapsulation layer 20 may be less than the encapsulation layer of prior IC package structures having a photoreceiver. For example, encapsulation layer 20 may be reduced by approximately 25 microns as compared with the encapsulation layer of prior IC package structures. Thus, the overall thickness of IC package structure 10 may be reduced.

Circuit board 12 may comprise any printed circuit board suitable to accommodate one or more IC devices, including IC package structure 10. Circuit board 12 may include a waveguide 50 and one or more mirrors 52. Waveguide 50 may comprise a rectangular or cylindrical tube or pipe, for example, operable to guide the path of light signals 30 through circuit board 12. The one or more mirrors 52 reflect light signals 30 toward and into photoreceiver 16.

FIG. 2 illustrates an example IC package structure 60 having a two-layer substrate 62 in accordance with one embodiment of the present invention. IC package structure 60 may be similar to IC package structure 10; however, substrate 62 is a two-layer substrate including a first conductive layer 64 formed on top side 66 of substrate 62 and a second conductive layer 68 formed on bottom side 70 of substrate 62. Like conductive layer 24 discussed above, each conductive layer 64 or 68 may include any one or more generally conductive materials, such as copper or gold, for example. In certain embodiments, each of conductive layers 64 and 68 is a copper trace formed on substrate 62.

FIG. 3 illustrates an example method of forming the example IC package structure 10 shown in FIG. 1. At step 100, single-layer substrate 14 is formed with conductive layer 24 formed on surface 26 of substrate 14. As discussed above, conductive layer 24 may be a copper trace formed on substrate 14. At step 102, light passage area 28 is formed in substrate 14. This may include forming a hole in substrate 14 and, in some embodiments, filling the hole with one or more substances having physical properties suitable for allowing the passage of light signals, such as glass, substantially transparent plastic filler, or other at least substantially transparent material such as a substantially transparent resin or epoxy.

At step 104, one or more at least substantially transparent materials, such as transparent plastic fillers, resins or epoxies, for example, are disposed generally on substrate 14 in the general area of light passage area 44. At step 106, photoreceiver 16 is flip-chip bonded to substrate 14 by solder bumps 40 such that side 36 having light receiving aperture 38 faces circuit board 12 and the transparent material disposed at step 104 is located in light passage area 44 between photoreceiver 16 and substrate 14. Photoreceiver 16 may be fine aligned to a target location on substrate 14. In certain embodiments, photoreceiver 16 may be aligned within a tolerance of approximately +/−10 microns. As shown in FIG. 1, light passage areas 28 and 44 are aligned to allow light signals 30 to be received into aperture 38 of photoreceiver 16. At step 108, underfill material is disposed around solder bumps 40 and around the transparent material in light passage areas 28 to form underfill 42.

At step 110, IC die 18 is flip-chip bonded to substrate 14 by solder bumps 46. However, IC die 18 may be otherwise bonded to substrate 14, such as by wire bonding, for example. At step 112, photoreceiver 16 and IC die 18 are encapsulated by encapsulation 20 to provide protection for the components of IC package structure 10, including photoreceiver 16 and IC die 18. As discussed above, encapsulation layer 20 may be formed over IC package structure 10 in any suitable manner, such as by transfer molding, compression molding, potting, or glob top processes.

At step 114, IC package structure 10 is surface mounted to circuit board 12 by solder balls 22 by any suitable method, such as using a solder reflow process, for example. In certain embodiments, the diameter of solder balls 22 is approximately 0.3 mm–0.5 mm, and the alignment accuracy of mounting IC package structure 10 to the target location on circuit board 12 is approximately +/−150 microns. In certain other embodiments, smaller solder balls 22 or no solder balls 22 are used to mount IC package structure 10 to circuit board 12 with greater alignment accuracy.

At step 116, light signals 30 are communicated through waveguide 50, reflected by one or more mirrors 52, and travel through light passage areas 28 and 44 and into aperture 38 of photoreceiver 16. At step 118, photoreceiver 16 translates received light signals 30 into digital signals and communicates the digital signals to die 18 via conductive layer 24.

Figure 4:
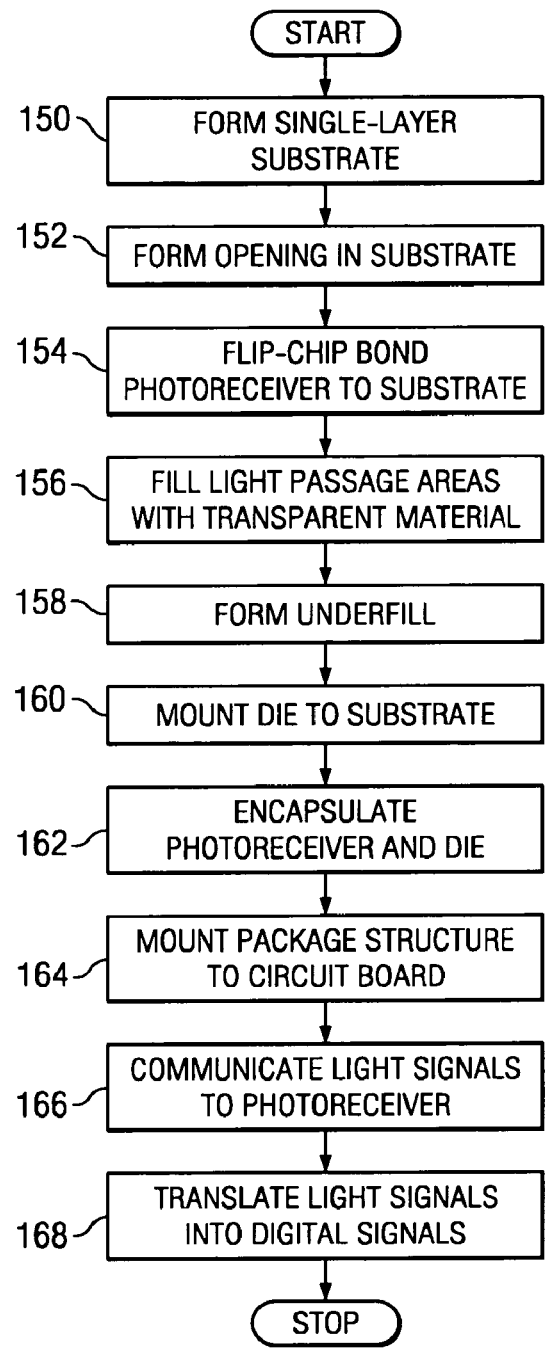
FIG. 4 illustrates another example method of forming the IC package structure shown in FIG. 1.

FIG. 4 illustrates another example method of forming the example IC package structure 10 shown in FIG. 1. At step 150, single-layer substrate 14 is formed with conductive layer 24 formed on surface 26 of substrate 14. As discussed above, conductive layer 24 may be a copper trace formed on substrate 14. At step 152, an opening is formed in substrate 14 that defines the extent of light passage area 28

At step 154, photoreceiver 16 is flip-chip bonded to substrate 14 by solder bumps 40 such that side 36 having light receiving aperture 38 faces circuit board 12 and such that an open area corresponding with light passage area 44 exists between photoreceiver 16 and light passage area 28 of substrate 14. Photoreceiver 16 may be fine aligned to a target location on substrate 14. In certain embodiments, photoreceiver 16 may be aligned within a tolerance of approximately +/−10 microns.

At step 156, one or more at least substantially transparent materials, such as transparent plastic fillers, resins or epoxies, for example, are disposed through the opening in substrate 14 formed at step 152 into light passage areas 28 and 44. The one or more materials disposed into light passage areas 28 and 44 may then be cured, if appropriate. Thus, light passage areas 28 and 44 may allow light signals 30 to be pass through light passage areas 28 and 44 and into aperture 38 of photoreceiver 16. At step 158, underfill material is disposed around solder bumps 40 and around the material disposed in light passage areas 28 at step 156 to form underfill 42.

At steps 160 through 168, IC die 18 is bonded to substrate 14, encapsulation 20 is disposed, IC package structure 10 is mounted to circuit board 12, light signals 30 are communicated through light passage areas 28 and 44 and into aperture 38 of photoreceiver 16, and photoreceiver 16 translates received light signals 30 into digital signals, as discussed above with reference to steps 110 through 118 of the method of FIG. 3.

It should be understood that in alternative embodiments, the present invention contemplates using methods with additional steps, fewer steps, or different steps, so long as the steps remain appropriate for forming an IC package structure having a photoreceiver flip-chip mounted to the package substrate at least to provide an IC package structure having a reduced size.

Although embodiments of the invention and its advantages have been described in detail, a person skilled in the art could make various alterations, additions, and omissions without departing from the spirit and scope of the present invention as defined by the appended claims.

What is claimed is:

1. An apparatus comprising an integrated circuit structure, the integrated circuit structure comprising:
    a substrate having a first side and a second side opposite the first side, the substrate including a first light passage area operable to allow light to pass through; and
    a photoreceiver having an aperture located on a first side of the photoreceiver, the photoreceiver being flip-chip mounted to the substrate such that the first side of the photoreceiver faces the second side of the substrate, the photoreceiver operable to translate light signals received through the aperture into digital signals and to transmit the digital signals;

wherein the first light passage area is aligned with the aperture of the photoreceiver such that the light signals may be received through the light passage area and into the aperture of the photoreceiver.

2. The apparatus of claim 1, further comprising a circuit board, wherein the integrated circuit structure is mounted to the circuit board such that the first side of the substrate faces the circuit board.

3. The apparatus of claim 1, further comprising a circuit board including a waveguide and one or more mirrors, the waveguide and the one or more mirrors operable to guide the light signals through the first light passage area in the substrate and into the aperture in the photoreceiver.

4. The apparatus of claim 1, wherein the substrate of the integrated circuit structure is a single-layer substrate including a single conductive layer formed on the second side of the substrate.

5. The apparatus of claim 1, wherein the substrate of the integrated circuit structure is a two-layer substrate including a first conductive layer formed on the first side of the substrate and a second conductive layer formed on the second side of the substrate.

6. The apparatus of claim 1, wherein the substrate of the integrated circuit structure has a thickness of less than 150 microns.

7. The apparatus of claim 1, wherein the integrated circuit structure further comprises an integrated circuit die mounted to the second side of the substrate and operable to receive the digital signals transmitted by the photoreceiver.

8. The apparatus of claim 7, wherein the integrated circuit structure further comprises an encapsulant covering the photoreceiver and the integrated circuit die.

9. The apparatus of claim 1, wherein the first light passage area comprises an open area.

10. The apparatus of claim 1, wherein one or more at least substantially transparent materials are disposed in the first light passage area.

11. The apparatus of claim 1, wherein the integrated circuit structure further comprises a second light passage area between the photoreceiver and the substrate, the second light passage area being aligned with the first light passage area and operable to allow light to pass through such that light signals may be received through both the first and second light passage areas and into the aperture of the photoreceiver.

12. The apparatus of claim 11, wherein the second light passage area comprises an open area.

13. The apparatus of claim 11, wherein one or more at least substantially transparent materials are disposed in the second light passage area.

14. The apparatus of claim 11, wherein the integrated circuit structure further comprises an underfill disposed generally between the photoreceiver and the substrate and around the second light passage area.

15. The apparatus of claim 14, wherein;
the underfill is at least substantially transparent; and
a portion of the underfill extends into the second light passage area such that the light signals may be received through the portion of the underfill extending into the second light passage area and into the aperture of the photoreceiver.

16. A method, comprising:

providing a substrate including a first light passage area operable to allow light to pass through, the substrate having a first side adapted to face a circuit board and a second side opposite the first side; and flip-chip mounting a photoreceiver to the substrate such that an aperture located on a first side of the photoreceiver faces the second side of the substrate, the aperture being aligned with the first light passage area of the photoreceiver such that light signals may be received through the light passage area and into the aperture of the photoreceiver, the photoreceiver being operable to translate the light signals into digital signals and to transmit the digital signals.

17. The method of claim 16, further comprising mounting the integrated circuit structure to a circuit board such that the first side of the substrate faces the circuit board.

18. The method of claim 16, further comprising communicating light signals through a waveguide coupled to the circuit board, through the first light passage area in the substrate, and into the aperture in the photoreceiver.

19. The method of claim 16, wherein the substrate comprises a single-layer substrate including a single conductive layer formed on the second side of the substrate.

20. The method of claim 16, wherein the substrate comprises a two-layer substrate including a first conductive layer formed on the first side of the substrate and a second conductive layer formed on the second side of the substrate.

21. The method of claim 16, wherein the substrate has a thickness of less than 150 microns.

22. The method of claim 16, further comprising mounting an integrated circuit die to the second side of the substrate, the integrated circuit die to receive the digital signals transmitted by the photoreceiver.

23. The method of claim 16, further comprising forming a second light passage area between the photoreceiver and the substrate such that the second light passage area is aligned with the first light passage area to allow light signals to pass through both the first and second light passage areas and into the aperture of the photoreceiver.

24. The method of claim 23, further comprising forming an underfill generally between the photoreceiver and the substrate and around the second light passage area.

25. An integrated circuit structure comprising:

a substrate having a first side and a second side opposite the first side, the substrate including a first light passage area operable to allow light to pass through, the substrate having a thickness of less than 150 microns;

a photoreceiver having an aperture located on a first side of the photoreceiver, the photoreceiver being flip-chip mounted to the substrate such that the first side of the photoreceiver faces the second side of the substrate, the photoreceiver operable to translate light signals received through the aperture;

a second light passage area between the photoreceiver and the substrate, the second light passage area being aligned with the first light passage area and the aperture of the photoreceiver such that light signals may be received through both the first and second light passage areas and into the aperture of the photoreceiver;

an integrated circuit die mounted to the second side of the substrate and operable to receive the digital signals transmitted by the photoreceiver; and an encapsulant covering the photoreceiver and the integrated circuit die.

26. The apparatus of claim 25, wherein the substrate of the integrated circuit structure is a single-layer substrate including a single conductive layer formed on the second side of the substrate.

27. The apparatus of claim 25, wherein the substrate of the integrated circuit structure is a two-layer substrate including a first conductive layer formed on the first side of the substrate and a second conductive layer formed on the second side of the substrate.

* * * * *